United States Patent [19]

Rambach

[11] 4,293,030

[45] Oct. 6, 1981

[54] METHOD OF AND MEANS FOR PASSIVELY COOLING A SHELTER CONTAINING A HEAT SOURCE

[75] Inventor: Claude Rambach, Rehovot, Israel

[73] Assignee: Ormat Turbines, Ltd., Yavne, Israel

[21] Appl. No.: 969,153

[22] Filed: Dec. 13, 1978

[30] Foreign Application Priority Data

Dec. 14, 1977 [GB] United Kingdom ............... 51979/77

[51] Int. Cl.³ ...................... F28D 15/00; F28F 27/00
[52] U.S. Cl. ................................ 165/40; 165/104.32;
165/104.33; 336/58; 361/385
[58] Field of Search ...................... 165/106, 32, 104 S,
165/105, 40; 336/58, 57, 55; 361/385

[56] References Cited

U.S. PATENT DOCUMENTS

| | | |
|---|---|---|
| 854,277 | 5/1907 | Darlington ..................... 336/58 X |
| 854,278 | 5/1907 | Darlington ..................... 336/58 X |
| 1,396,996 | 11/1921 | Copman . |
| 1,853,490 | 4/1932 | Anderson . |
| 2,342,211 | 2/1944 | Newton . |
| 2,499,736 | 3/1950 | Kleen . |
| 2,499,736 | 3/1950 | Kleen ......................... 165/104 S X |
| 3,472,314 | 10/1969 | Balch . |
| 3,648,767 | 3/1972 | Balch ........................... 165/106 |

FOREIGN PATENT DOCUMENTS

| | | |
|---|---|---|
| 414159 | 5/1967 | Australia . |
| 800753 | 12/1950 | Fed. Rep. of Germany . |
| 691648 | 10/1930 | France . |
| 887267 | 11/1943 | France . |
| 1393510 | 2/1965 | France . |
| 2154864 | 5/1973 | France . |
| 2200488 | 4/1974 | France . |
| 451706 | 8/1936 | United Kingdom ............. 336/58 |

Primary Examiner—Albert W. Davis
Attorney, Agent, or Firm—Sandler & Greenblum

[57] ABSTRACT

The passive cooling of a shelter containing a heat source is achieved by utilizing a thermal liquid in an accumulator, a first heat transfer loop for thermosiphonically transferring heat from the interior of the shelter to the liquid in the accumulator when the liquid is cooler than the interior of the shelter, and a second heat transfer loop for thermosiphonically transferring heat from the liquid in the accumulator to the environment when the latter is cooler than the liquid in the accumulator.

8 Claims, 1 Drawing Figure

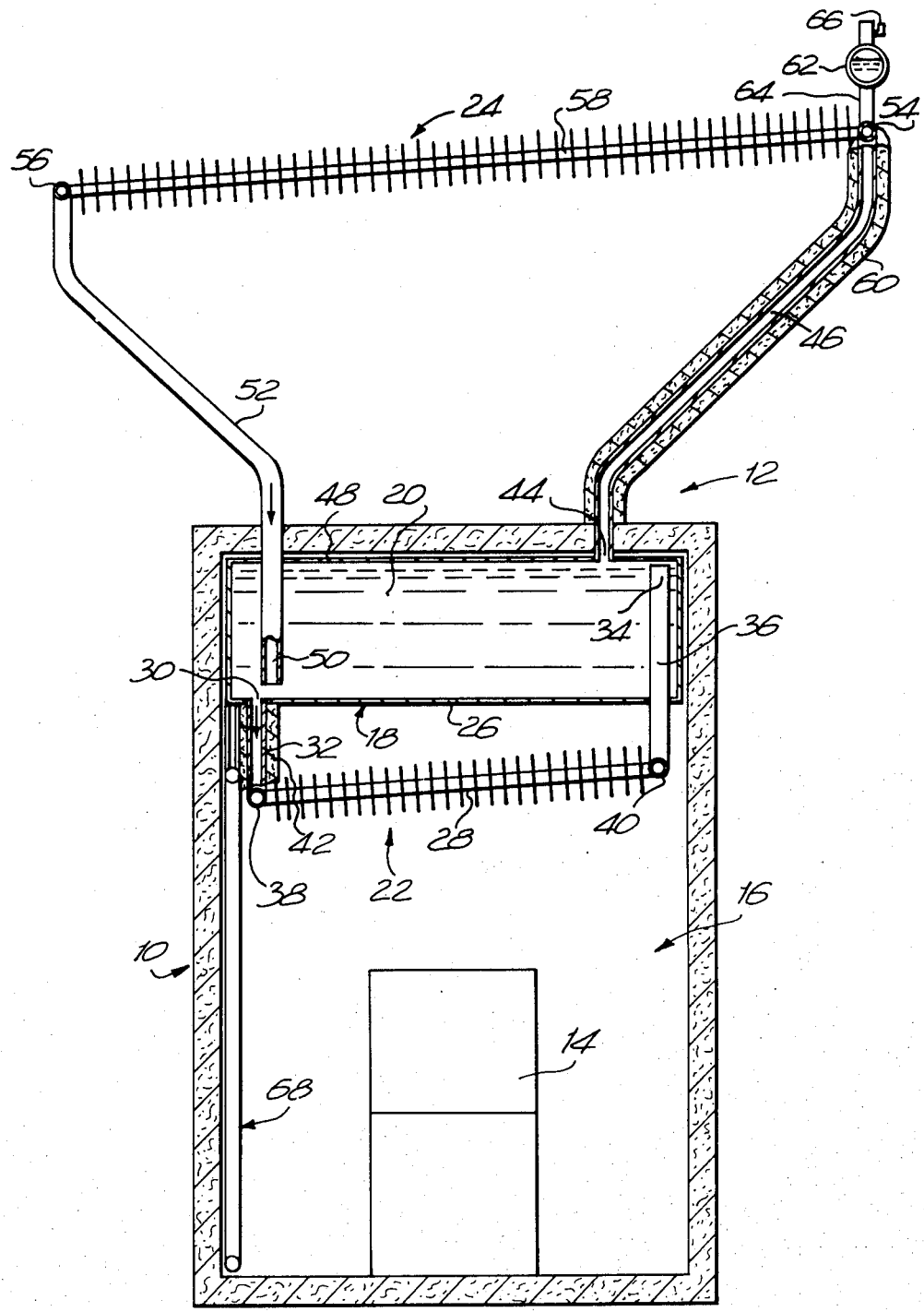

METHOD OF AND MEANS FOR PASSIVELY COOLING A SHELTER CONTAINING A HEAT SOURCE

BACKGROUND OF THE INVENTION

This invention relates to a method of and means for passively cooling a shelter containing a heat source and located in a diurnal environment which is periodically hotter and cooler than the interior of the shelter.

A shelter located in a diurnal environment which is periodically hotter and cooler than the interior of the shelter, and which has an external and internal heat load is termed herein, a shelter of the type described. A shelter housing electrical communication equipment as a part of a communication relay station remotely located in a tropical environment is an example of a shelter of the type described. In such case, hot ambient air, as well as sunshine, constitute the external heat load on the shelter, while electronic equipment housed within the shelter constitutes the internal heat load. Reliability of electronic communication equipment is assured only if the temperature in the interior of the shelter is maintained within predetermined limits. For this reason, a heavily insulated shelter is employed and day-time cooling is required because of the internal and external heat load. At night, some cooling is also necessary due to the internal heat load.

Conventionally, active cooling systems, such as conventional air-conditioning units, have been employed to cool remotvely located shelters of the type described. Active cooling requires the generation of power in excess of that necessary to drive the electronic equipment. In order to reduce power consumption, it would be very desirable to eliminate the extra load imposed on the power generator by the shelter cooling system. It is therefore an object of the present invention to provide a new and improved method of and means for passively cooling a shelter of the type described without using any source of energy apart from the natural difference in temperature between the environment and the interior of the shelter.

SUMMARY OF THE INVENTION

According to the present invention, the passive cooling of a shelter containing a heat source is achieved by utilizing a thermal liquid in an accumulator, a first heat transfer loop for thermosiphonically transferring heat from the interior of the shelter to the liquid in the accumulator when the liquid is cooler than the interior of the shelter, and a second heat transfer loop for thermosiphonically transferring heat from the liquid in the accumulator to the environment when the latter is cooler than the liquid in the accumulator. For reference purposes, the term "thermosiphon" describes the method of circulation of a liquid arising from the slight difference in density of hot and cold liquids.

BRIEF DESCRIPTION OF THE DRAWINGS

An embodiment of the invention is illustrated in the single figure of the accompanying drawing which is a vertical section taken through a shelter of the type described provided with the present invention.

DETAILED DESCRIPTION

Referring now to the drawing, reference numeral 10 designates a shelter of the type described passively cooled by apparatus 12 in accordance with the present invention. Shelter 10 is in the form of a hollow, totally enclosed, well insulated structure provided with suitable doors (not shown) for gaining access to internal heat load 14 located in the interior 16 of the shelter. Load 14 may be electronic communication equipment that operates on a 24 hour basis when the shelter is part of a communication relay station. In such case, an appropriate shelter is about 1 ×1 ×2 meters; and the heat load is about 150 watts during operation.

Apparatus 12, in accordance with the present invention, comprises accumulator tank 18 containing thermal liquid 20, first heat transfer loop 22 associated with the interior of the shelter, and second heat transfer loop 24 associated with the exterior of the shelter. Preferably, tank 18 is mounted within the shelter as shown in the drawing to avoid insulating the tank which would be necessary if it were outside. In addition, it is preferred to mount the tank in the upper half of the shelter just below the roof, as shown in the drawing, in order to take advantage of the natural draft of air inside the shelter when the heat source 14 is in the lower half of the shelter. In such case, source 14 is cooled by the flow of air inside the shelter, the air heated by the source rising and coming in contact with the cool bottom 26 of the tank 18.

Thermal liquid 20 is preferably water which can be protected against freezing during winter nights by the addition of antifreeze. However, other liquids can be used, the criteria for selecting a liquid being high specific heat, high density, low viscosity and a high heat-transfer film coefficient in pipes.

The first heat transfer loop 22 comprises one or more vertically extending pipes, the upper end of each of which is connected to the accumulator tank, a plurality of inclined finned heat transfer conduits connected by headers to the lower end of each of the pipes, and thermosiphonic means for establishing a thermosiphonic liquid transport driving force in this loop. Preferably four pipes are provided, one in each corner of the tank; and a pair of pipes is shown in the drawing. The upper end 30 of first pipe 32 of the pair is connected to and opens into bottom 26 of the tank while the upper end 34 of second pipe 36 of the pair extends through bottom 26 and terminates inside the tank at a higher elevation than end 30.

The lower end of pipes 32 and 36 are respectively connected to horizontally disposed headers 38, 40, header 38 being at a lower elevation than header 40 so that each of finned conduits 28 connected at opposite ends to the headers, is inclined to the horizontal as indicated. First pipe 32 is insulated as indicated at 42 with a low heat-transfer material for maintaining the temperature of the thermal liquid in pipe 32 below the temperature of the air inside the shelter when the air temperature exceeds the temperature of the thermal liquid. The thermosiphonic means of loop 22 comprises the difference in elevation of ends 30 and 34 of the pipes, the difference in elevation of headers 38 and 40, and the insulation 42 as will be explained below.

The second heat transfer loop 24 comprises one or more of vertically extending pipes, the lower end of each of which is connected to the accumulator tank, a plurality of inclined finned heat transfer conduits connected by headers to the upper end of each of the pipes, and thermosiphonic means for establishing a thermosiphonic liquid transport driving force in this loop. Four pipes can be provided, one in each corner of the tank, but only a pair of pipes are shown in the drawings. The lower end 44 of first pipe 46 is connected to and opens into top 48 of tank 18 while the lower end 50 of second pipe 52 extends through top 48 and terminates inside the tank at a lower elevation than end 44 of the first pipe.

The upper ends of pipes 46 and 52 are respectively connected to horizontally disposed headers 54, 56, header 54 being at a higher elevation than header 56 so that each of finned conduits 58, connected at opposite ends to the headers, is inclined to the horizontal as indicated. First pipe 46 is insulated as indicated at 60 with a low heat transfer material for maintaining the temperature of the thermal liquid in pipe 46 above ambient air temperature external to the shelter when the ambient air temperature is below the temperature of the thermal liquid. The thermosiphonic means of loop 24 comprises the difference in elevation of ends 44 and 50 of the pipes, the difference in elevation of headers 54, 56 and the insulation 60.

Finally, expansion tank 62 is provided and is connected at 64 to header 54 which is at the highest elevation of the system. Air relief valve 66 is always open so that the liquid 20 is always under atmospheric pressure to permit the liquid to freely contract and expand under heat stresses. By reason of this tank, thermal liquid 20 completely fills both heat transfer loops and accumulator tank 18.

Recalling that the shelter is located in a diurnal environment whose temperature cyclically increases above and decreases below the air temperature inside the shelter, the operation of the present invention is explained now starting at a point in the cycle where the temperature of the shelter air first exceeds the temperature of the thermal liquid. In a practical situation, this point will likely occur early in the morning as the sun is rising and the ambient air temperature begins to increase. As explained below, the thermal liquid will have been cooled during the night by the operation of the second heat transfer loop.

If the temperature of the air in the shelter exceeds the temperature of the liquid in conduit 28, heat is transferred into the liquid raising its temperature and decreasing its density. Because pipe 32 is insulated and pipe 36 is in thermal contact with the shelter air, the density of liquid in pipe 32 will exceed the density of liquid in pipe 36. Since header 38 is below header 40 (i.e., pipe 32 extends further below bottom 26 than pipe 36), the weight of the column of liquid in pipe 32 exceeds the weight of the column of liquid in pipe 36. This difference in weight is accentuated by the difference in elevation between open ends 30 and 34 of the pipes. As a consequence of the difference in weight between the liquid in the pipes, a thermosiphonical driving force exists, such force causing a counter clockwise circulation of liquid (as viewed in the drawing). That is to say, cooler and more dense liquid in the bottom of tank 18 enters inlet 30 of pipe 32, flows downwardly into header 38 and then through conduit 28 where the liquid absorbs heat given off by load 14. The lighter density liquid rises into header 40 from which it flows upwardly through pipe 36 and exits at outlet 34 of pipe 36. The auto-circulation thus established is encouraged by the inclination of conduit 28. Such inclination should be of the order of magnitude of 2°-5°.

A thermosiphonical driving force in loop 22 can be established with a temperature differential between the liquid in the tank and the air inside the shelter as small as 3° C. With such temperature differential, the liquid in heat transfer loop 22 is heated to about half this differential.

Auxiliary heat transfer loop 68, similar to loop 28 can be provided in the event the heat transfer area of conduits 28 is insufficient to achieve the required cooling of the heat load 14. In such case, loop 68 is connected to tank 18 much the same as loop 28 and functions in the same way to thermosiphonically cool the interior of the shelter.

The thermosiphon effect in loop 22 causes the system to operate as a one-way heat valve that will only reject heat from the shelter into the accumulator tank. Autocirculation in loop 22 automatically stops if the temperature of the air in the shelter drops below the temperature of the thermal liquid in tank 18. In general, loop 22 is effective to cool the interior of the shelter as long as the temperature of the liquid in tank 18 is less than the air temperature in the shelter. This situation will exist when the design is proper, during the hot daytime portion of the cycle of environmental conditions. When ambient conditions are such that ambient air becomes cooler than the liquid in tank 18 (i.e., during the nighttime portion of the cycle of environmental conditions), heat transfer loop 24 becomes effective to reject heat stored in the liquid into the environment surrounding the shelter by convection and radiation, the ambient air serving as a heat sink.

If the ambient air temperature falls below the temperature of the liquid in the tank, the liquid in conduit 58 and pipe 52 is cooled and becomes denser than the liquid in pipe 46. Auto-circulation thus begins in loop 24, circulation occurring in a counter-clockwise direction as seen in the drawing. The higher conduit 58 is placed above the tank 18, the greater will be the absolute value of the weight difference and the greater will be the thermosiphonic driving force. The difference in weight of the columns of liquid is enhanced by the difference in elevation between inlet 44 and outlet 50. By sloping conduit 58 from 2°-5°, the autocirculation is facilitated.

Loop 24 will have a thermosiphonical driving force therein, such force being established when the temperature differential, between the liquid in the tank and ambient air inside the shelter, is as small as 2° C. As a consequence, the liquid in loop 24 can be cooled during the night very close to ambient air temperature, and even lower if conduit 58 radiates to the sky.

The auto-circulation in loop 24 automatically stops when the temperature of the ambient air becomes warmer than the thermal liquid in the tank. Thus, the same physical conditions that initiate circulation when ambient air temperature decreases below the liquid temperature, stop such circulation when the opposite temperature difference exists. Consequently, loop 24 acts as a heat valve that can only reject heat from tank 18 to the environment.

Fluid friction in the various pipes and conduits of the two heat transfer loops 22 and 24 can be minimized by proper selection of diameters in conjunction with the required flow rates to achieve the desired cooling of a given internal head load subject to a given external heat load. For example, the vertical pipe diameters can be about 25 mm, the overall height of loop 24 can be 1 meter, and that of loop 22 about 0.5 meters. The velocity of flow in the various pipes will be of the order of magnitude of 0.1 m/sec.

A typical illustration of the invention is the permanent cooling of a telecommunication shelter. The heat load is composed of a daytime external heat load from the ambient and of the diurnal internal heat load from the electronic equipment. By nighttime, both thermosiphon loops 22 and 24 work, the loop 22 cooling the inside shelter air and the loop 24 rejecting heat to the ambient. By daytime, only loop 22 works cooling the inside shelter air.

An illustration of the cooling capacity of the invention is shown in the following results, assuming pipes of 25 mm diameter and of liquid flow rate of 0.1 m/sec:

Electronic Equipment Heat Load: 150 W, on 24 hours/day
Shelter Dimensions: 1000×1000×2000 mm.
Overall Heat Transfer Coefficient of the Walls: 0.6° K. cal/hr.m$^2$° C.
Average Daytime External Heat Load from Ambient: 50 W, on 12 hours
Average Nighttime Heat Losses Through Walls: 25 W, on 12 hours.
Heat Rejection Capability of Loop 24: 325 W, on 12 nighttime hours
Maximum Daytime Ambient Temperature: 35° C.
Minimum Nighttime Ambient Temperature: 18° C.
Water Accumulator Temperature at End of Day: 27° C.
Water Accumulator Temperature at Dawn: 20° C.
Inside Shelter Air Temperature at End of Day: 30 ° C.
Water Tank Content: 300 liters.
Dimensions of Loop 24: 1500×1500×50 mm.
Shelter Cooler Dimensions: 900×900×100 mm.

It is believed that the advantages and improved results furnished by the apparatus of the present invention are apparent from the foregoing description of the several embodiments of the invention. Various changes and modifications may be made without departing from the spirit and scope of the invention as sought to be defined in the claims that follow.

I claim:

1. Apparatus for passively cooling the interior of a shelter containing a heat source and located in a diurnal environment which is periodically hotter and cooler than the interior of the shelter comprising:
   (a) an accumulator containing a thermal liquid;
   (b) a first heat transfer loop, including thermosyphonic means, for transferring heat by transferring the liquid from the interior of the shelter to the liquid in the accumulator when the liquid is cooler than the interior of the shelter; and
   (c) a second heat transfer loop, including thermosyphonic means, for transferring heat by transferring the liquid from the liquid in the accumulator to the environment when the latter is cooler than the thermal liquid in the accumulator.

2. Apparatus for passively cooling the interior of a shelter containing a heat source and located in a diurnal environment which is periodically hotter and cooler than the interior of the shelter comprising:
   (a) an accumulator containing a thermal liquid;
   (b) a first heat transfer loop for transferring heat from the interior of the shelter to the liquid in the accumulator when the liquid is cooler than the interior of the shelter;
   (c) the first heat transfer loop including first and second upstanding pipes whose upper ends are connected to the accumulator, the lower end of the first pipe being at a lower elevation than the lower end of the second pipe;
   (d) a heat transfer conduit exposed to the interior of the shelter and interconnecting the lower ends of the pipes;
   (e) thermosyphonic means for establishing a thermosyphonic liquid transport driving force in the first heat transfer loop;
   (f) a second heat transfer loop for transferring heat from the liquid in the accumulator to the environment when the latter is cooler than the thermal liquid in the accumulator;
   (g) the second heat transfer loop including first and second upstanding pipes whose lower ends are connected to the accumulator, the upper end of the first pipe being at a higher elevation than the upper end of the second pipe;
   (h) a heat transfer conduit exposed to the environment and interconnecting the upper ends of the pipes; and
   (i) thermosyphonic means for establishing thermosyphonical liquid transport driving forces in the second loop.

3. Apparatus according to claim 2 wherein the thermosiphonic means includes insulation on the first pipe.

4. Apparatus according to claim 3 wherein the thermosiphonic means also includes positioning of the upper end of the second pipe at a higher elevation in the accumulator than the upper end of the first pipe.

5. Apparatus according to claim 4 wherein the shelter is insulated and the heat source is electrical means housed therein.

6. Apparatus according to claim 5 including an auxiliary thermosiphonic loop in the shelter connected to the accumulator.

7. Apparatus according to claim 5 where the thermal liquid includes water.

8. Apparatus according to claim 7 including an expansion tank connected to the second heat transfer loop at its highest elevation.

* * * * *